United States Patent
Coushaine

(10) Patent No.: US 7,682,052 B2
(45) Date of Patent: Mar. 23, 2010

(54) HEAT SINK

(75) Inventor: Charles M. Coushaine, Rindge, NH (US)

(73) Assignee: Osram Sylvania Inc., Danvers, MA (US)

( * ) Notice: Subject to any disclaimer, the term of this patent is extended or adjusted under 35 U.S.C. 154(b) by 590 days.

(21) Appl. No.: 11/472,134

(22) Filed: Jun. 21, 2006

(65) Prior Publication Data
US 2007/0297183 A1    Dec. 27, 2007

(51) Int. Cl.
F21V 29/00    (2006.01)
(52) U.S. Cl. .................. 362/373; 362/294; 362/572
(58) Field of Classification Search .............. 362/294, 362/373, 572
See application file for complete search history.

(56) References Cited

U.S. PATENT DOCUMENTS

| | | |
|---|---|---|
| 2004/0120151 A1 | 6/2004 | Ostler |
| 2004/0121281 A1 | 6/2004 | Fischer |
| 2004/0160192 A1 | 8/2004 | Nakano |
| 2004/0190305 A1 | 9/2004 | Arik |
| 2005/0174780 A1* | 8/2005 | Park ........................... 362/294 |
| 2005/0231983 A1* | 10/2005 | Dahm ........................ 362/800 |

* cited by examiner

Primary Examiner—Sandra L O'Shea
Assistant Examiner—Mary Zettl
(74) Attorney, Agent, or Firm—Robert F. Clark

(57) ABSTRACT

An LED lamp has a housing comprising a heat conductive body arrayed about a longitudinal axis with a tubular projection extending therefrom coaxial with the longitudinal axis. The tubular projection has a distal end attached to the heat conductive body and a proximal end opposite thereto. A motor is positioned within the tubular projection and has a tubular, vaned fan blade operatively connected thereto. A plurality of LED components is attached to an outside surface of the tubular projection at the proximal end. An air inlet is formed at the proximal end of the tubular projection and a plurality of air outlets are spaced about the tubular projection between the distal end of the tubular projection and the LED components. A base is operatively attached to the housing for attachment to a power supply.

7 Claims, 1 Drawing Sheet

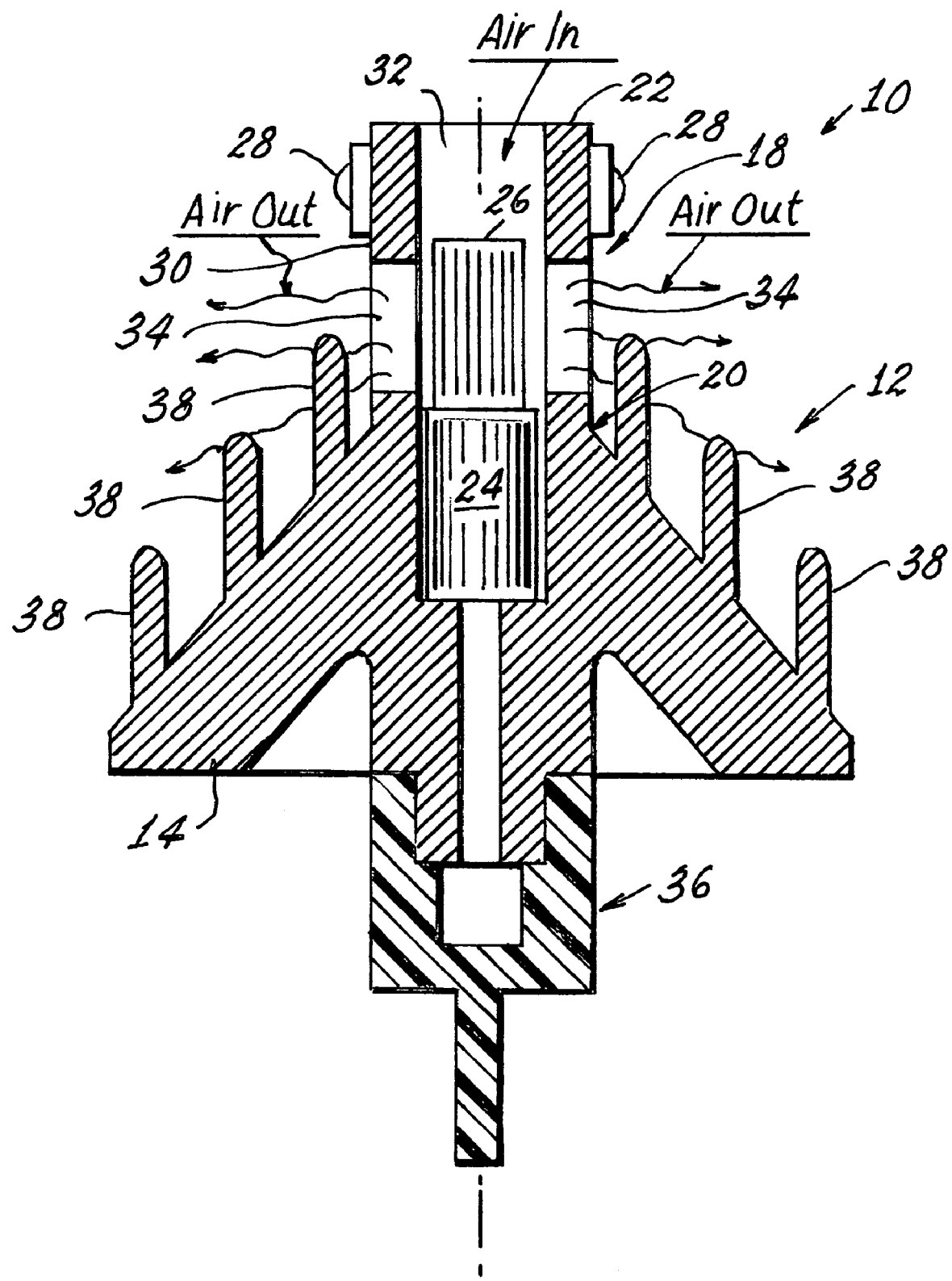

HEAT SINK

TECHNICAL FIELD

This invention relates generally to heat sinks and more particularly to heat sinks for LED lamps. Still more particularly, it relates to an LED lamp utilizing such a heat sink as an integral part of the lamp.

BACKGROUND ART

Light emitting diodes (LED or LEDs) are solid-state light sources that are noted for their long life and brilliant, saturated color emission. They have found increasing use in automotive applications as center high mount stoplights and tail lights. As the light output demands have risen it has become necessary to increase the power to these light sources with a concomitant increase in the amount of heat generated when the lights are operating. Since subjecting the solid-state light sources to high heat detrimentally effects their operation, heat sinks are employed to remove the generated heat. In the past these heat sinks have generally been added-on constructions attached to the light source.

It would be an advance in the art to provide a safe and convenient means to remove excess heat from light emitting diodes that are operated at high power requirements.

DISCLOSURE OF INVENTION

It is, therefore, an object of the invention to obviate the disadvantages of the prior art.

It is another object of the invention to enhance the operation of LED lamps.

Yet another object of the invention is the provision of a heat sink assembly useable with many types of electronic devices.

These objects are accomplished, in one aspect of the invention, by an LED lamp that comprises a housing comprising a heat conductive body arrayed about a longitudinal axis with a tubular projection extending therefrom coaxial with the longitudinal axis. The tubular projection has a distal end attached to the body and a proximal end opposite thereto. A motor is positioned in the tubular projection and has a tubular, vaned fan blade operatively connected to it. LED components are attached to an outside surface of the tubular projection at the proximal end thereof. An air inlet is provided at the proximal end of the tubular projection and a plurality of air outlets are spaced about the tubular projection. A base is operatively attached to the housing for attachment to a power supply.

During operation of the lamp the fan that is enclosed within the heat sink draws air in through the air inlet and out through the air outlets, thus drawing away the heat generated by the lamp.

BRIEF DESCRIPTION OF THE DRAWINGS

The single FIGURE is a cross-sectional, elevational view of an embodiment of the invention.

BEST MODE FOR CARRYING OUT THE INVENTION

For a better understanding of the present invention, together with other and further objects, advantages and capabilities thereof, reference is made to the following disclosure and appended claims taken in conjunction with the above-described drawings.

Referring now to the drawing with greater particularity, there is shown an LED lamp 10 that comprises a housing 12 having a heat conductive body 14 arrayed about a longitudinal axis 16 with a tubular projection 18 extending therefrom coaxial with the longitudinal axis 16, the tubular projection 18 having a distal end 20 attached to the heat conductive body 14 and a proximal end 22 opposite thereto. In a preferred embodiment of the invention the body 12 is formed of a cast metal or metal alloy such as copper, aluminum or zinc or a heat conductive plastic.

A motor 24 is positioned within the cavity of the tubular projection 18 and has a tubular, vaned or rotary cage type fan blade 26 operatively connected thereto. The fan motor 24 can be of any suitable type, such as the vibrator motor used in cell phones. These motors are very small, inexpensive and readily available.

A plurality of LED components 28 are attached to an outside surface 30 of the tubular projection 18 at the proximal end 22 thereof. These LEDs can be of any convenient type, such as OSRAM Optosemicondutors Dragons© available from Osram Corporation, or Lumileds Luxeons© available from Philips Corporation.

An air inlet 32 is formed at the proximal end 22 of the tubular projection 18 and a plurality of air outlets 34 are spaced about the tubular projection 18, intermediate the proximal and distal ends of the tubular projection 18.

A base 36 is operatively attached to the housing 12 for attachment to a power supply. The type of base employed will be determined, of course, by the end use of the lamp, but can be of the type known as an S8 base for use in automotive applications, or an Edison type screw base or bayonet base, as the case may be.

In a preferred embodiment of the invention the heat conductive body 14 is substantially conical and, thus, the tubular projection 18 projects from the apex of the cone.

A plurality of heat radiating fins 38 project from the heat conductive body and stand in the flow of air as that flow emanates from the air outlets 34.

The housing 12 can be employed as a heat sink with virtually any electronic device that generates heat during its operation since the included fan and motor greatly reduce the size and complexity of such devices.

While there have been shown and described what are present considered to be the preferred embodiments of the invention, it will be apparent to those skilled in the art that various changes and modifications can be made herein without departing from the scope of the invention as defined by the appended claims.

What is claimed is:

1. An LED lamp comprising:
    a housing comprising a heat conductive body arrayed about a longitudinal axis with a tubular projection extending therefrom coaxial with said longitudinal axis, said tubular projection having a distal end attached to said body and a proximal end opposite thereto;
    a motor positioned in said tubular projection having a tubular, vaned fan blade operatively connected thereto;
    a plurality of LED components attached to an outside surface of said tubular projection at said proximal end thereof;
    an air inlet at said proximal end of said tubular projection and a plurality of air outlets spaced about said tubular projection; and
    a base operatively attached to said housing for attachment to a power supply.

2. The LED lamp of claim 1 wherein said air outlets are positioned between said distal end of said tubular projection and said LED components.

3. The LED lamp of claim 1 wherein said heat conductive body is substantially conical.

4. The LED lamp of claim 3 wherein a plurality of heat radiating fins project from said heat conductive body.

5. A heat sink comprising:
- a housing comprising a heat conductive body arrayed about a longitudinal axis with a tubular projection extending therefrom coaxial with said longitudinal axis, said tubular projection having a distal end attached to said body and a proximal end opposite thereto;
- a motor positioned in said tubular projection having a tubular, vaned fan blade operatively connected thereto;
- an air inlet at said proximal end of said tubular projection and a plurality of air outlets spaced about said tubular projection; and
- a base operatively attached to said housing for attachment to a power supply.

6. The heat sink of claim 5 wherein said heat conductive body is substantially conical.

7. The heat sink of claim 6 wherein a plurality of heat radiating fins project from said heat conductive body.

* * * * *